United States Patent [19]
Tomomatsu et al.

[11] Patent Number: 5,945,691
[45] Date of Patent: *Aug. 31, 1999

[54] SEMICONDUCTOR DEVICE FOR PREVENTING DESTRUCTION DURING A TURN-OFF STATE

[75] Inventors: Yoshifumi Tomomatsu, Fukuoka; Mitsuyoshi Takeda, Tokyo; Noriyuki Soejima, Fukouka, all of Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/567,418

[22] Filed: Dec. 5, 1995

[30] Foreign Application Priority Data

Jul. 20, 1995 [JP] Japan ................................. 7-184085

[51] Int. Cl.⁶ .................. H01L 29/861; H01L 29/866; H01L 31/107

[52] U.S. Cl. ..................... 257/104; 257/106; 257/603

[58] Field of Search ................................. 257/173, 104, 257/106, 487, 495, 603, 610, 611, 617, 133

[56] References Cited

U.S. PATENT DOCUMENTS

| 3,174,882 | 3/1965 | Logan | 257/104 |
| 3,254,234 | 5/1966 | Sziklai et al. | 257/104 |
| 5,210,601 | 5/1993 | Kitagawa et al. | 257/133 |

*Primary Examiner*—Steven H. Loke
*Attorney, Agent, or Firm*—Oblon, Spivak, McClelland, Maier & Neustadt, P.C.

[57] ABSTRACT

In order to inhibit destruction during a turn-off state, a cathode electrode (6) is not connected to the overall major surface of a semiconductor substrate (10), but selectively connected to a region which is substantially opposed to an anode electrode (5). When a forward voltage is applied, therefore, an electric field which is generated in the semiconductor substrate (10) is distributed substantially only in a region immediately under a P-type diffusion layer (2), to hardly spread into a peripheral region positioned outside the region. Consequently, carriers which are injected from the P-type diffusion layer (2) and an N⁺ layer (4) into an N⁻ layer (1) hardly spread to the peripheral region, but are stored substantially only in the region immediately under the P-type diffusion layer (2). Thus, concentration of a reverse current is relieved during a turn-off state in a peripheral edge portion of the P-type diffusion layer (2). Consequently, destruction during a turn-off state caused by concentration of the reverse current is prevented or inhibited.

2 Claims, 4 Drawing Sheets

SEMICONDUCTOR DEVICE FOR PREVENTING DESTRUCTION DURING A TURN-OFF STATE

BACKGROUND OF THE INVENTION

1. Field of the Invention

The present invention relates to a semiconductor device, and more particularly, it relates to an improvement for preventing the semiconductor device from destruction during a turn-off state.

2. Description of the Background Art

FIG. 5 is a perspective sectional view showing the structure of a conventional power diode. In this device 100, an $N^+$ layer 4 is formed on the lower major surface of a semiconductor substrate (semiconductor body) 10 into which an N-type impurity is introduced in low concentration by diffusing an N-type impurity in high concentration, while a P-type diffusion layer 2 is selectively formed on a central portion of the upper major surface by selectively diffusing a P-type impurity. Annular P-type diffusion layers 3, for example, are selectively formed in the peripheral portion of the P-type diffusion layer 2 in the upper major surface, to enclose the P-type diffusion layer 2. Namely, the semiconductor substrate 10 has the $N^+$ layer 4, the P-type diffusion layer 2, the P-type diffusion layers 3, and an $N^-$ layer 1 which is a region excluding these layers.

Further, an anode electrode 5 is in ohmic contact with an exposed surface of the P-type diffusion layer 2, while a cathode electrode 6 is in ohmic contact with an exposed surface of the opposite $N^+$ layer 4. Namely, the anode electrode 5 and the cathode electrode 6 are formed on opposite major surfaces to hold the semiconductor substrate 10.

The P-type diffusion layer 2 is not formed on the overall upper major surface of the semiconductor substrate 10 but is only selectively formed on a partial region, in order to ensure strength against a reverse voltage, i.e., blocking voltage. The blocking voltage is increased as the width L of the peripheral portion of the P-type diffusion layer 2 is increased. The blocking voltage is further improved by providing the annular P-type diffusion layers 3 in the peripheral portion of the P-type diffusion layer 2.

The $N^+$ layer 4 is adapted to prevent a depletion layer from reaching the cathode electrode 6 upon application of a reverse voltage while thinning the semiconductor substrate 10 and suppressing forward voltage drop, thereby attaining high blocking voltage. The width L of the peripheral portion and the thickness D of the semiconductor substrate 10 are set in the range of $L \geq D$ in general.

This device 100 operates as follows. When a forward voltage is applied across the anode electrode 5 and the cathode electrode 6, holes are injected from the P-type diffusion layer 2 into the $N^-$ layer 1, while electrons are injected from the $N^+$ layer 4 into the $N^-$ layer 1. Consequently, a forward current flows from the anode electrode 5 to the cathode electrode 6. Namely, the device 100 conducts.

When the forward voltage which is applied across the anode electrode 5 and the cathode electrode 6 is reversed to a reverse voltage, i.e., when the device 100 is turned off, a reverse current transiently flows from the cathode electrode 6 to the anode electrode 5 until the electrons and the holes which are stored in the $N^-$ layer 1 are collected in the $N^+$ layer 4 and the P-type diffusion layer 2 respectively. Namely, the device 100 continues its conducting state until the carriers stored in the $N^-$ layer 1 disappear, and enters a cutoff state after the disappearance of the stored carriers.

As hereinabove described, the device 100 conducts when a forward voltage is applied thereto, while the same is cut off after a lapse of a constant transient time when a reverse voltage is applied thereto. Namely, the device 100 serves as a diode.

In the conventional device 100, the P-type diffusion layer 2 is selectively formed on the upper major surface of the semiconductor substrate 10 and the width L of the peripheral portion is set to be in excess of a constant size in order to ensure blocking voltage, as hereinabove described. On the other hand, the cathode electrode 6 is formed to cover the overall lower major surface of the semiconductor substrate 10.

When a forward voltage is applied to the device 100, therefore, an electric field generated in the semiconductor substrate 10 spreads not only in a region immediately under the P-type diffusion layer 2 but to a peripheral region 13 which is an outer region thereof, as typically shown by arrows in a front sectional view of FIG. 6. Consequently, the carriers which are injected from the P-type diffusion layer 2 and the $N^+$ layer 4 into the $N^-$ layer 1 spread also to the peripheral region 13. Namely, the carriers are widely stored also in the peripheral region 13 outside the region immediately under the P-type diffusion layer 2.

When the device 100 is turned off, therefore, the carriers which are also widely stored in the peripheral region 13 of the semiconductor substrate 10 rush to a peripheral edge portion 7 of the P-type diffusion layer 2. Namely, a reverse current flows in the peripheral edge portion 7 in high density. Consequently, the device 100 is easy to be destructed during a turn-off state under high speed switching.

SUMMARY OF THE INVENTION

According to a first aspect of the present invention, a semiconductor device comprises a semiconductor body having two major surfaces, a first conductivity type first semiconductor layer which is exposed on one major surface, a second conductivity type second semiconductor layer which is selectively formed on a partial region of an exposed surface of the first semiconductor layer, a first main electrode which is connected to an exposed surface of the second semiconductor layer, and a second main electrode which is connected to the other major surface of the semiconductor body, and the second main electrode is selectively connected to a partial region of the other major surface.

According to a second aspect of the present invention, the partial region of the other major surface is a region in the other major surface which is substantially opposed to the second semiconductor layer.

According to a third aspect of the present invention, a semiconductor device comprises a semiconductor body having two major surfaces, a first conductivity type first semiconductor layer which is exposed on one major surface, a second conductivity type second semiconductor layer which is selectively formed on a partial region of an exposed surface of the first semiconductor layer, a first main electrode which is connected to an exposed surface of the second semiconductor layer, and a second main electrode which is connected to the other major surface of the semiconductor body, and a region projecting the first main electrode in the semiconductor body is defined as a central region, while a region outside a region projecting the second semiconductor layer the defined as a peripheral region, and the lifetime in a second region which is a region included in the peripheral region is set to be shorter than that in a first region which is a region included in the central region at least on the average in the first semiconductor layer.

According to a fourth aspect of the present invention, the lifetime in the first semiconductor layer has substantially stepwise distribution between the first and second regions to be shorter in the second region than in the first region.

According to a fifth aspect of the present invention, a lifetime killer is selectively introduced into at least the second region in the peripheral region, thereby attaining the substantially stepwise distribution.

In the device according to the first aspect of the present invention, the first and second main electrodes are connected to the one and other major surfaces of the semiconductor body respectively, whereby a current which is supplied through these main electrodes flows to pass through the semiconductor body. Carriers are stored in the first semiconductor layer when a forward voltage is applied across the first and second main electrodes so that a forward current flows to the junction between the first and second semiconductor layers, a region distributing the stored carriers is reduced as compared with the conventional device since the second main electrode is selectively connected to the partial region without covering the overall other major surface of the semiconductor body.

Thus, relieved is such a phenomenon that a reverse current which transiently flows due to movement of the stored carriers is concentrated to a peripheral edge portion of the second semiconductor layer when the forward voltage applied across the first and second main electrodes is reversed to a reverse voltage. Consequently, the device is prevented or inhibited from destruction during a turn-off state caused by concentration of the reverse current.

In this device, further, high blocking voltage is attained since the second semiconductor layer is selectively formed on a partial region of one major surface of the semiconductor body. Namely, this device compatibly implements high blocking voltage and inhibition of destruction during a turn-off state.

In the device according to the second aspect, the second main electrode is connected in the region of the other major surface which is substantially opposed to the second semiconductor layer, whereby an electric field which is generated in the semiconductor body upon application of a forward voltage hardly spreads into the peripheral region of the second semiconductor layer. Therefore, the stored carriers hardly spread into the peripheral region. Thus, concentration of the reverse current is further effectively relieved.

In the device according to the third aspect, the first and second main electrodes are connected to the one and other major surfaces of the semiconductor body respectively, whereby a current which is supplied through these main electrodes flows to pass through the semiconductor body. Carriers are stored in the first semiconductor layer when a forward voltage is applied across the first and second main electrodes so that a forward current flows to the junction between the first and second semiconductor layers, while disappearance of the carriers is quickened on the average in the second region as compared with the first region since the lifetime of the second region corresponding to the peripheral region is set to be shorter than that of the first region corresponding to the central region in the first semiconductor layer on the average. Therefore, storage of the carriers is suppressed in the second region.

Thus, relieved is such a phenomenon that a reverse current which transiently flows due to movement of the stored carriers is concentrated to a peripheral edge portion of the second semiconductor layer when the forward voltage applied across the first and second main electrodes is reversed to a reverse voltage. Consequently, the device is prevented or inhibited from destruction during a turn-off state caused by concentration of the reverse current.

In this device, further, high blocking voltage is attained since the second semiconductor layer is selectively formed on the partial region of one major surface of the semiconductor body. In addition, the second main electrode may be connected to the overall other major surface of the semiconductor body, and it is not necessary to take the relative positions of the first and second main electrodes into consideration. Therefore, it is not necessary to carry out mask alignment between the first and second main electrodes which are opposed to each other through the semiconductor body in a step of forming the second main electrode. Namely, this device compatibly implements inhibition of destruction caused by a reverse current while maintaining high blocking voltage and readiness of formation of the second main electrode.

In the device according to the fourth aspect, the lifetime in the first semiconductor layer substantially stepwisely differs between the first and second regions, whereby concentration of a reverse current is further effectively relieved.

In the device according to the fifth aspect, the lifetime killer is selectively introduced into at least the second region in the peripheral region, thereby attaining substantially stepwise distribution of the lifetime of the first semiconductor layer. Therefore, it is possible to employ a simple method of selectively diffusing a heavy metal into the peripheral region or selectively applying radiation to the peripheral region for fabrication of the device. Namely, the device is easy to fabricate.

An object of the present invention is to provide a semiconductor device which can ensure blocking voltage and is hardly destructed during a turn-off state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1

Figure 1:
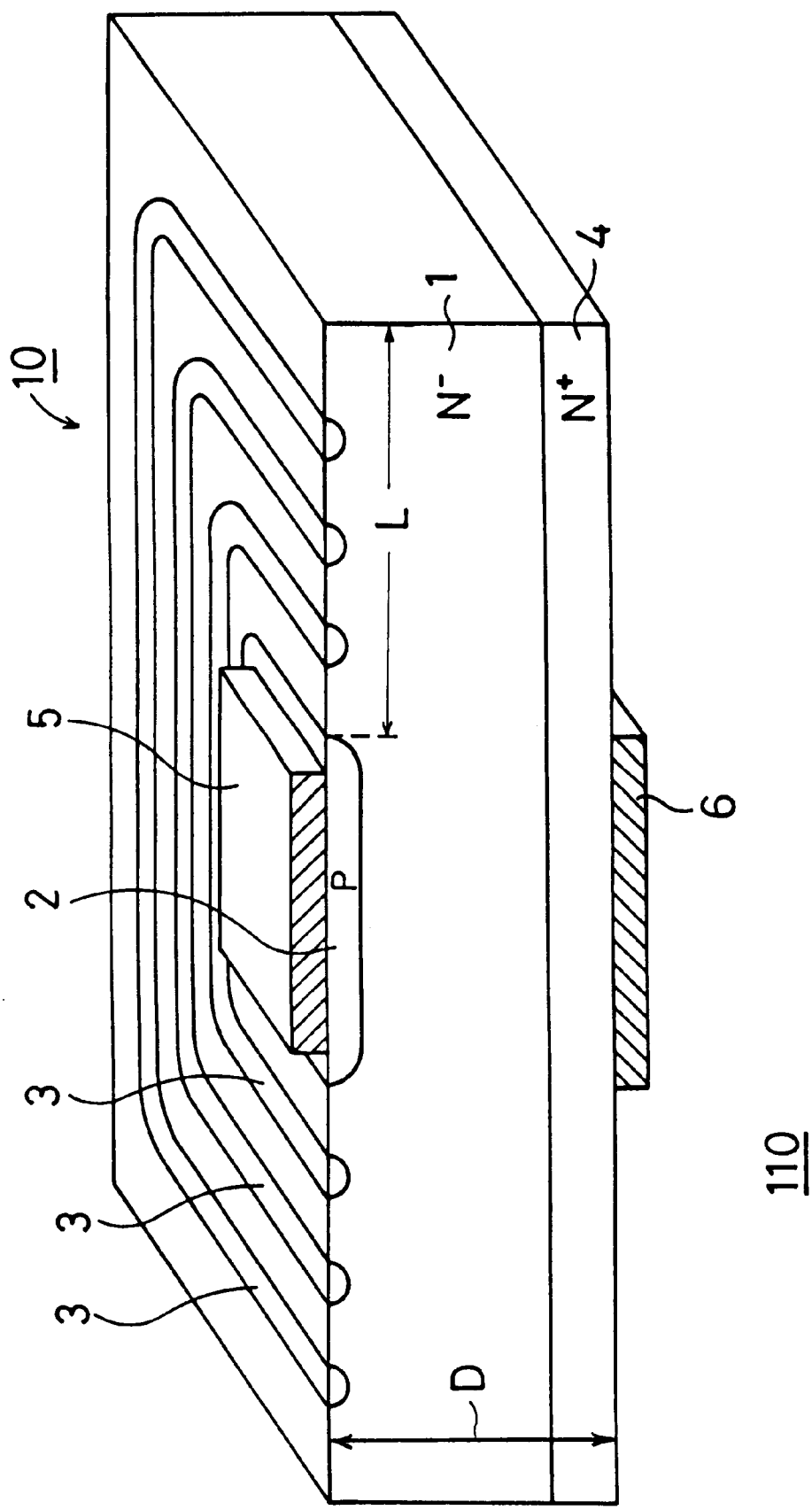
FIG. 1 is a perspective sectional view showing a device according to a preferred embodiment 1.

FIG. 1 is a perspective sectional view showing the structure of a power diode according to a preferred embodiment 1. In the following drawings, portions identical or corresponding to those of the conventional device shown in FIGS.

5 and 6 are denoted by the same reference numerals, to omit redundant description.

Figure 2:
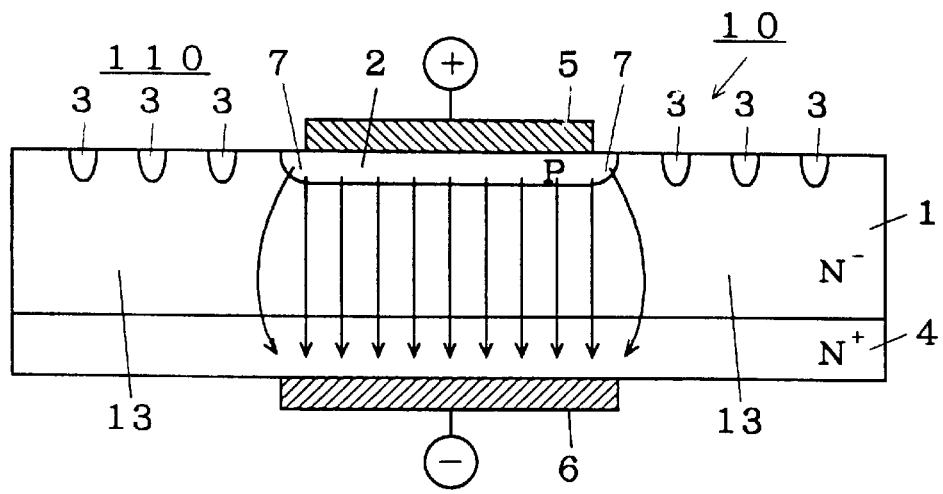
FIG. 2 is a front sectional view of the device shown in FIG. 1.

The device 110 shown in FIG. 1 is characteristically different from the conventional device in a point that a cathode electrode 6 is substantially identical in area to a P-type diffusion layer 2 and is selectively formed on the lower major surface of a semiconductor substrate 10 to be substantially opposed to the P-type diffusion layer 2. When a forward voltage is applied, therefore, an electric field in the semiconductor device 10 is distributed substantially only in a region immediately under the P-type diffusion layer 2 as typically shown in a front sectional view of FIG. 2 by arrows, to hardly spread into a peripheral region 13 which is positioned outside the region.

Consequently, carriers which are injected from the P-type diffusion layer 2 and an N$^+$ layer 4 into an N$^-$ layer 1 hardly spread to the peripheral region 13. Therefore, the carriers are stored substantially only in the region immediately under the P-type diffusion layer 2, whereby storage of the carriers is suppressed in the peripheral region 13. Thus, concentration of a reverse current is relieved during a turn-off state in a peripheral edge portion 7 of the P-type diffusion layer 2. Consequently, destruction caused by concentration of the reverse current is prevented or inhibited.

In the device 110, the P-type diffusion layer 2 is selectively formed on the upper major surface of the semiconductor substrate 10 similarly to the conventional device 100, and the width L of its peripheral portion is set in excess of a constant size. Thus, attained is an effect of inhibiting destruction during a turn-off state by selectively forming a cathode electrode 6 while maintaining blocking voltage of the conventional device 100. Namely, the device 110 compatibly implements high blocking voltage and prevention or inhibition of destruction during a turn-off state. Preferably, the width L of the peripheral portion and the thickness D of the semiconductor substrate 10 are set in the range of L≧D, similarly to the conventional device 100.

In the device 110, concentration of a P-type impurity in a contact surface of the P-type diffusion layer 2 with an anode electrode 5 is preferably selected in the range of $1 \times 10^{15}$ cm$^{-3}$ to $1 \times 10^{18}$ cm$^{-3}$, and the depth of the P-type diffusion layer 2 from the upper major surface is preferably selected in the range of 0.1 μm to several 10 μm.

While the cathode electrode 6 is formed substantially in the same area as the P-type diffusion layer 2 in the device 110, a device hardly causing destruction during a turn-off state as compared with the conventional device 100 is implemented when the cathode electrode 6 is selectively formed on a partial region in the lower major surface to be narrower than the overall major surface of the semiconductor substrate 10, even if the same is wider than the P-type diffusion layer 2. When the cathode electrode 6 is formed in an area which is narrower than that of the P-type diffusion layer 2, on the other hand, the carrier storage region is further reduced and hence the effect is further improved. Namely, a suitable effect is attained in response to the width of the cathode electrode 6.

Preferred Embodiment 2

Figure 3:
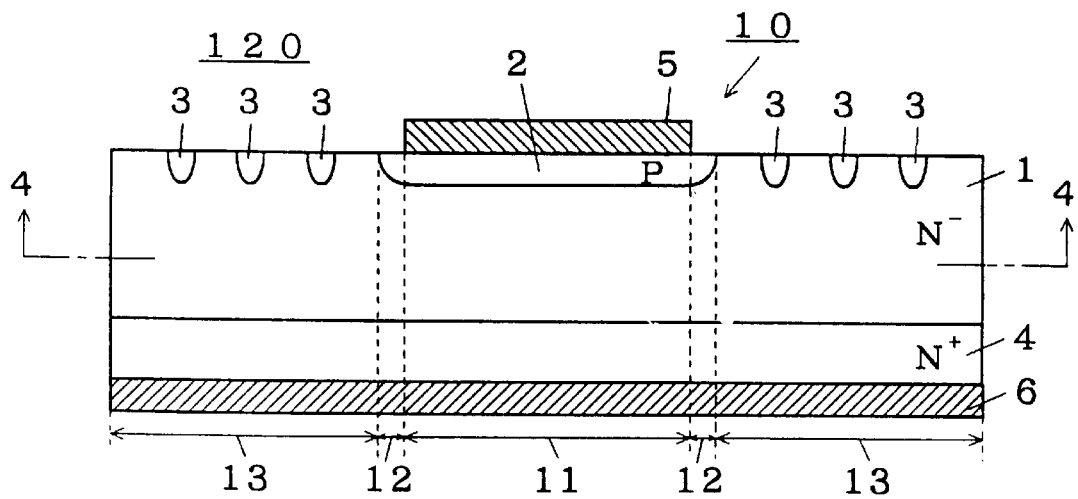
FIG. 3 is a front sectional view showing a device according to a preferred embodiment 2.

FIG. 3 is a front sectional view showing a power diode according to a preferred embodiment 2. This device 120 is characteristically different from the conventional device 100 in a point that lengths of the lifetimes of carriers are stepped between a central region 11 which is a region immediately under an anode electrode 5 and a peripheral region 13 which is a region outside a region (region combining the central region 11 and a peripheral edge region 12) immediately under a P-type diffusion layer 2.

Namely, a lifetime killer, which is a crystal defect prompting disappearance of the carriers as a recombination center of the carriers, is selectively introduced into the peripheral region 13 in this apparatus 120, whereby the lifetime in the peripheral region 13 is set to be short as compared with the central region 11. In order to selectively introduce the lifetime killer, a heavy metal such as gold or platinum may be selectively diffused into the peripheral region 13, for example. Alternatively, radiation such as an electron beam may be selectively applied to the peripheral region 13. Either method can be readily executed.

Figure 4:
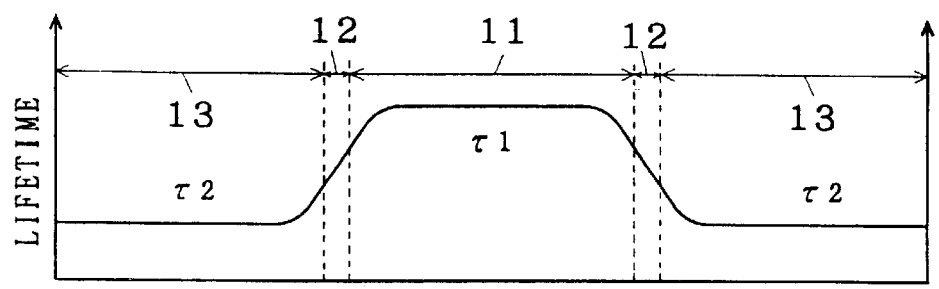
FIG. 4 illustrates lifetime distribution of the device shown in FIG. 3.
Figure 5:
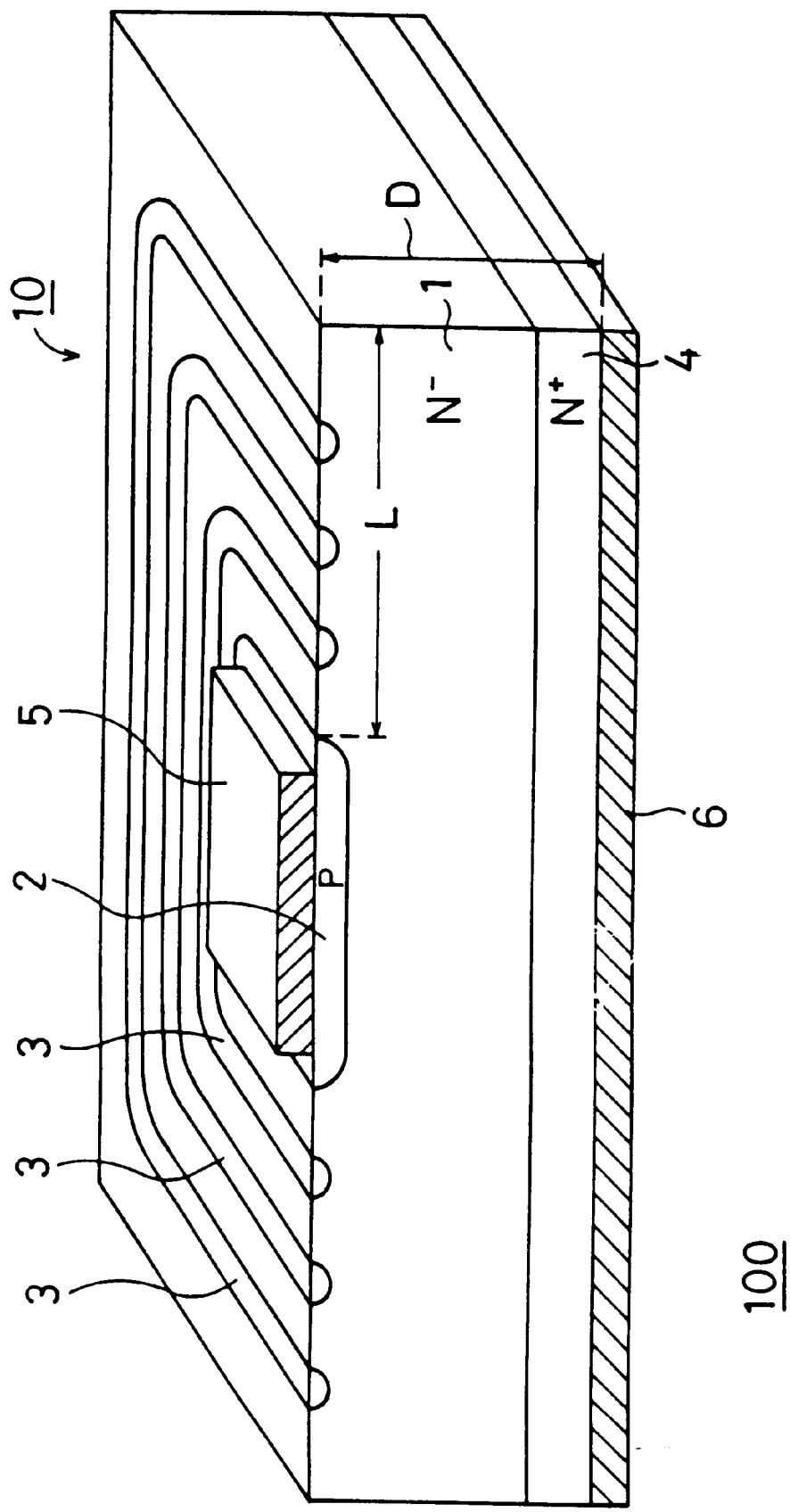
FIG. 5 is a perspective sectional view showing a conventional device.
Figure 6:
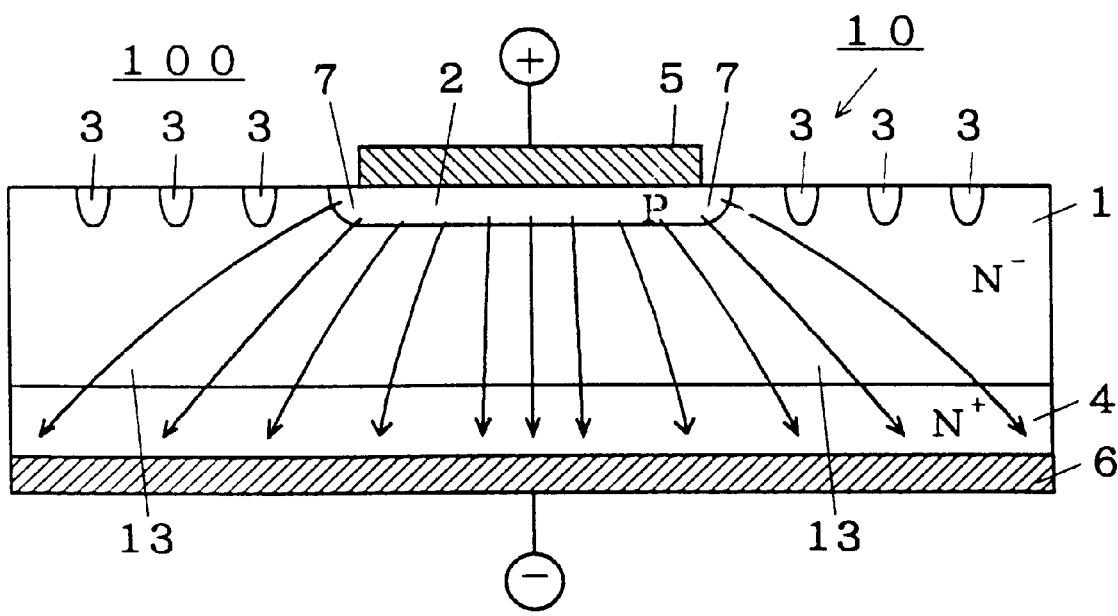
FIG. 6 is a front sectional view of the device shown in FIG. 5.

FIG. 4 is a distribution diagram typically showing the profiles of the lifetimes along the line A—A in FIG. 3. As shown in FIG. 4, steps are provided between the lifetimes $\tau_1$ and $\tau_2$ in the central region 11 and the peripheral region 13, and the lifetime $\tau_2$ is set to be shorter than the lifetime $\tau_1$.

The lifetime $\tau_2$ is set to be short as described above, whereby disappearance of carriers in the peripheral region 13 is prompted. Namely, storage of the carriers is suppressed and concentration of stored carriers is suppressed in the peripheral region 13. Consequently, concentration of a reverse current is relieved during a turn-off state in the peripheral edge portion of the P-type diffusion layer 2, whereby destruction during a turn-off state caused by concentration of the reverse current is prevented or inhibited.

In the device according to this preferred embodiment, the cathode electrode 6 may be formed on the overall lower major surface of a semiconductor substrate 10, whereby it is not necessary to carry out mask alignment with an anode electrode 5 which is formed on an opposite side through the semiconductor substrate 10 in a step of forming the cathode electrode 6. Namely, the step of forming the cathode electrode 6 is advantageously simple.

When it is necessary to shorten the lifetime of the central region 11 too, the lifetime killer may be further introduced homogeneously into the overall semiconductor substrate 10 including the central region 11 and the peripheral edge region 12, thereby shortening the overall lifetime of the semiconductor substrate 10 while maintaining the step between the lifetimes of the central region 11 and the peripheral region 13.

When selective diffusion of a heavy metal or selective application of radiation is employed, the lifetime of not only an N$^-$ layer 1 but the peripheral region 13 including an N$^+$ layer 4, a P-type diffusion layer 3 etc. is shortened. In order to relieve concentration of the reverse current and inhibit destruction during a turn-off state, the lifetime of at least the N$^-$ layer 1 may be sufficiently shortened in the peripheral region 13. However, the effect of relieving concentration of the reverse current remains unchanged also when the lifetime of not only the N$^-$ layer 1 but another portion such as the N$^+$ layer 4 is shortened in the peripheral region 13.

Further, the boundary between the long lifetime $\tau_1$ and the short lifetime $\tau_2$ may not be strict along the profiles illustrated in FIG. 4, but a suitable effect is attained when the lifetime of the peripheral region 13 is shorter than that of the central region 11 on the average, in response to the degree thereof.

Modifications (1) While the above preferred embodiments have been described with reference to power diodes, the present invention is also applicable to a diode which is not for a power use. In the power diode, however, the effect of preventing destruction during a turn-off state particularly remarkably appears since a high reverse voltage is applied in an ordinary usage in addition to a large amount of storage carriers due to a high forward current density.

(2) Further, the present invention is not restricted to a diode, but is widely applicable to a semiconductor device in which a semiconductor layer of a conductivity type different from that of a peripheral portion is selectively formed on one major surface of a semiconductor substrate having two major surfaces, one main electrode is connected to an exposed surface of this semiconductor layer and another main electrode is connected to the other major surface of the semiconductor substrate, in general. Also in such a general semiconductor device, an effect of inhibiting destruction of the device can be attained since concentration of a reverse current to a peripheral edge portion of the semiconductor layer is relieved.

While the invention has been shown and described in detail, the foregoing description is in all aspects illustrative and not restrictive. It is therefore understood that numerous modifications and variations can be devised without departing from the scope of the invention.

What is claimed is:

1. A power diode semiconductor device comprising:

a first semiconductor layer structure of a first conductivity type having first and second sides and having a relative lightly doped impurity semiconductor layer and a relative highly doped impurity semiconductor layer;

a second semiconductor layer of a second conductivity type formed in a partial and central portion on a first side of the first semiconductor layer structure;

a first electrode contacting the second semiconductor layer; and a second electrode formed on the second side of the first semiconductor layer structure, the second electrode having substantially a same overall area as the second semiconductor layer and being formed opposite the first electrode;

wherein said device has no other electrode than said first and second electrodes.

2. A power diode semiconductor device according to claim 1, further comprising at least one annular third semiconductor layer formed around the second semiconductor layer.

* * * * *

UNITED STATES PATENT AND TRADEMARK OFFICE
CERTIFICATE OF CORRECTION

PATENT NO. : 5,945,691

DATED : August 31, 1999

INVENTOR(S): Yoshifumi TOMOMATSU, et al.

It is certified that an error appears in the above-identified patent and that said Letters Patent is hereby corrected as shown below:

On the title page, item [75], the third inventor's city is incorrect. It should be:

--Noriyuki Soejima, Fukuoka, Japan--

Signed and Sealed this

Eighteenth Day of July, 2000

Attest:

Q. TODD DICKINSON

*Attesting Officer*      *Director of Patents and Trademarks*